United States Patent [19]

Hovengen

[11] 4,112,534
[45] Sep. 12, 1978

[54] WASHER FOR NYLOPRINT PRINTING BLOCKS OR THE LIKE

[76] Inventor: Oyvind Hovengen, 3370 Vikersund, Norway

[21] Appl. No.: 771,995

[22] Filed: Feb. 25, 1977

[30] Foreign Application Priority Data

Feb. 27, 1976 [NO] Norway .................................. 760662

[51] Int. Cl.² .............................................. A46B 13/02
[52] U.S. Cl. ...................................... 15/77; 15/21 R; 51/120
[58] Field of Search ............... 15/21 R, 21 C, 77, 102; 134/6, 9; 51/120

[56] References Cited

U.S. PATENT DOCUMENTS

| 2,948,087 | 8/1960 | Caton ..................................... 15/77 X |
| 3,421,168 | 1/1969 | Bartel ..................................... 15/21 R |
| 4,023,229 | 5/1977 | Blight ....................................... 15/77 |

Primary Examiner—Edward L. Roberts

[57] ABSTRACT

An apparatus for washing out of printing blocks of the "Nyloprint" type or the like is provided, comprising a brush device which is coupled to a driving means and adapted to be moved across a printing block which, during the washing, is fixedly disposed in a container with a cleaning bath in which the printing block and the brush device is immersed. The brush device comprises at least two brush units which are rotatably mounted about respective rotational axes, and which by means of a motion mechanism are adapted to move along a circular path during simultaneous rotation about their rotational axes, the brush units having an orientation and a size resulting in mutual overlapping during the rotation of said units.

8 Claims, 4 Drawing Figures

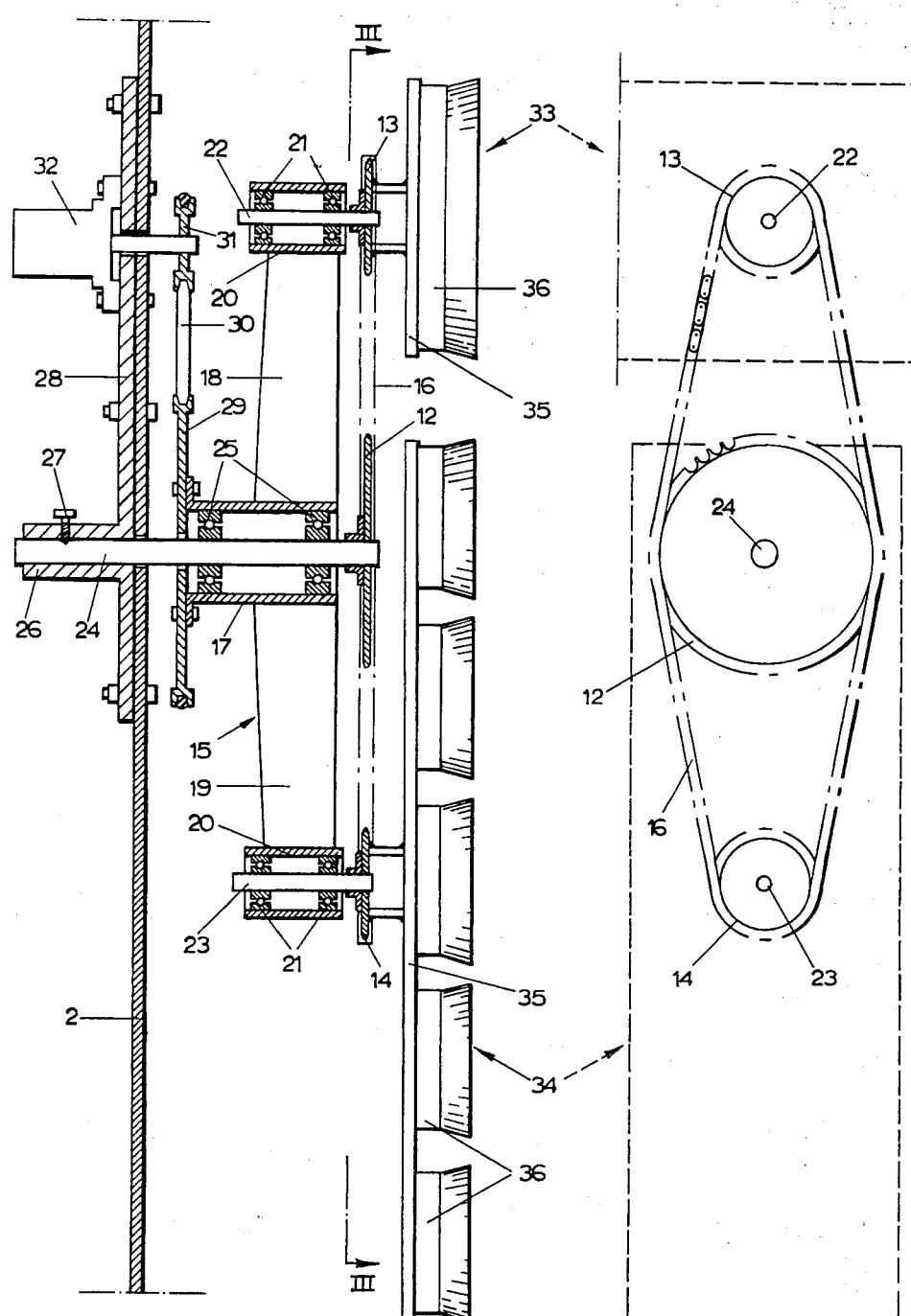

WASHER FOR NYLOPRINT PRINTING BLOCKS OR THE LIKE

The present invention relates to an apparatus for washing out of printing blocks of the "Nyloprint" type or the like, comprising a brush device coupled to a driving means and adapted to be moved across a printing block which, during the washing, is fixedly disposed in a container with a cleaning bath in which the printing block and the brush device is immersed.

In the making of printing cliches according to the so-called "Nyloprint" method the printing blocks are covered with a nylon emulsion which, during the manufacture, is illuminated on those places which are to indicate text, symbols or the like. In the non-illuminated areas the nylon emulsion is to be removed, and this takes place by the washing out in an apparatus containing a suitable cleaning liquid. The previously known apparatuses for this purpose operate either by flushing or by moving brushes, which are mounted transversely between chains, across the printing blocks without any variation in working direction. This results in poor washing in "shadow portions", as the brushes always attack from the same side. Those types of apparatus which utilize flushing, have a tendency to flush away small points and thin strokes, because powerful jets are required which receive a laterally directed effect when hitting the printing block. Further, the previously used apparatuses are expensive both in purchase and with respect to maintenance, e.g. by replacement of brush units.

The object of the invention is to provide an apparatus which gives very effective and simultaneously gentle washing out by means of brushes overlapping the movements of each other in constantly changing attack directions, and which is of a simple and reliable construction which is able to work in long operating periods without maintenance costs in the form of cleaning, replacement of cleaning bath or parts, etc.

For the achievement of the above mentioned objects there is provided an apparatus of the type set forth above which, according to the invention, is characterized in that the brush device comprises at least two brush units which are rotatably mounted about respective rotational axes, and which by means of a motion mechanism are adapted to move along a circular path during simultaneous rotation about their rotational axes, the brush units having an orientation and a size resulting in mutual overlapping during the rotation of said units.

The invention will be more closely described in the following with reference to the drawings, wherein FIG. 1 shows a partly sectioned side view of an apparatus according to the invention;

FIG. 2 shows a view in enlarged scale and partly in section, of the brush means of the apparatus together with the motion mechanism and driving means thereof;

FIG. 3 shows a schematic plan view along the lines III — III in FIG. 2, of the gears and driving chain of the motion mechanism.

Figure 1:
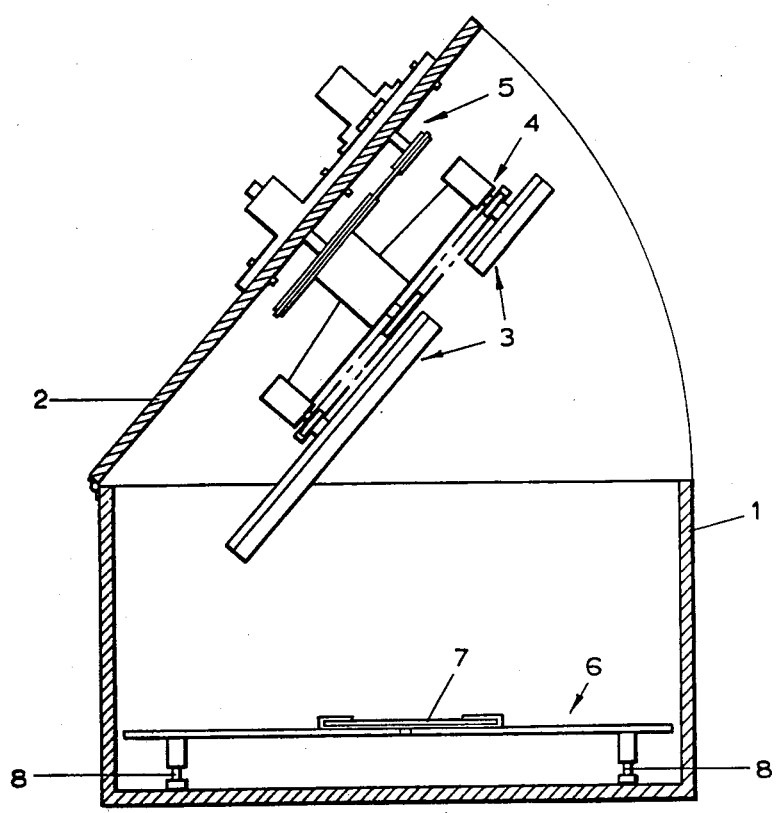
Figure 4:
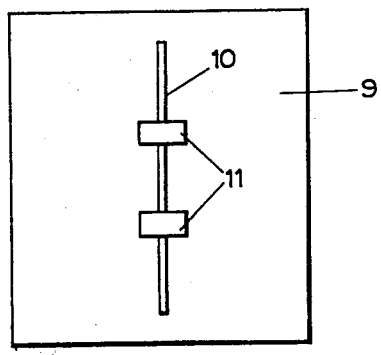
FIG. 4 shows a schematic plan view in reduced scale of the mounting bridge for printing blocks in the apparatus.

The embodiment shown in FIG. 1 comprises a box-shaped container 1 (shown in section) having a lid or a cover 2 on the underside of which the brush device 3 with motion mechanism 4 and driving means 5 is mounted. By lowering of the cover the brushes are lowered towards a mounting bridge 6 disposed on the bottom of the box or case for attachment of an illuminated printing block 7 which is to be washed out. The mounting bridge rests on legs 8 with adjustable height, so that desired brush pressure against the printing block may be achieved. As schematically shown in FIG. 4, the mounting bridge comprises a plate 9 which is provided with one or more slots 10 for a sliding means in the form of slidable holding pieces 11 for mounting of printing blocks of different size. The slot or slots also have an additional function which is to be mentioned in connection with the function of the apparatus.

In FIGS. 2 and 3 a preferred embodiment of the brush device of the apparatus with motion mechanism and driving means is shown in more detail. The main parts of the motion mechanism comprise a stationary gear 12 and a pair of gears 13 and 14 which are diametrically opposed thereto and rotatably mounted on a supporting means 15, and further a chain 16 which is running around said gears and is also in engagement with the stationary gear 12, all three gears lying in the same plane. The supporting means consists of a hub member 17 having a pair of diametrically opposed, oppositely directed arms 18, 19 which at their outer ends are provided with cylindrical sleeves 20 carrying ball bearings 21 into which there are driven shafts 22 and 23, respectively, for the gears 13 and 14. The gear 12 is attached on a shaft 24 on which also the hub member 17 is journalled by means of ball bearings 25. The shaft 24 is fixedly mounted to the cover 2 of the container in that the shaft is extended through a hole through the cover and a boss member 26 and fixed by means of a set screw 27. The boss member 26 is a part of a support plate 28 which is suitably attached to the container cover.

To the hub member 17 is fixed a drive pulley 29 which by way of a trapezoid belt or V-belt 30 or the like is connected with a driving pulley 31 on the drive shaft of an electric driving motor 32 which is mounted on the support plate 28. Instead of drive pulleys with V-belt drive there can be used gears and chain drive, possibly via a suitable gearing.

On each of the rotatable gears 13 and 14 there is fixedly mounted a brush unit 33 and 34, respectively, of which each consists of an elongate carrier plate 35 on which there is attached a number of replaceable brushes 36 (in the shown example 5 brushes in each unit). As shown the brush units have an orientation and extension or size resulting in mutual overlapping during their rotation.

By rotation of the supporting means 15 by means of the drive motor 32 the rotatable gears 13 and 14 are moved in a circular path and will then work as planetary gears and rotate about their axes because of their engagement with the chain 16 which is fixed as a result of its engagement with the stationary gear 12. Thereby the brush units 33 and 34 are rotated at the same time as they are moved around in the circular path. The gear ratio between the stationary gear 12 and the rotatable gears 13 and 14 is adjusted so that each brush unit becomes a rotation wherein the same brush movements on a printing block do not repeat themselves until after a great number of revolutions.

Instead of using a chain in engagement with a stationary gear it is as an alternative possible to use a gear rim with an inner toothing for engagement with the gears 13 and 14 which will then move as planetary wheels along the gear rim. However, a chain with engaging gears has a good self-cleaning effect, which is of essential importance. It is also conceivable to use more than two planetary wheels if one wants more than two working brush units.

The described apparatus can also be built with reversable driving means and be programmed for regular, automatic change of rotational direction. By providing the apparatus with a timing watch and with sound and/or light warning, the apparatus can work without attendance from the start until itself gives notice that the washing process is terminated.

By operation of the apparatus for execution of a washing process a ready illuminated printing block is fixed on the mounting bridge and immersed in a bath consisting of a mixture of 80% of 96% alcohol (with 2% MIK added) and 20% water. The bath should have a working temperature of 20° – 22° C. After lowering of the container cover with the brush device and appropriate adjustment of the mounting bridge with the printing block, the drive motor is started and the brushes are then moved repeatedly across the printing block in all directions, and wash successively away that part of the nonilluminated plastic film which has been dissolved by the liquid. During the washing out the continued influence of the liquid on the film is facilitated as presupposed by the construction of the block or plate. When the brushes pass the longitudinally extending slot or slots in the mounting plate, dissolved coating which has stuck to the brushes is wiped away, and thus automatic cleaning effect for the brushes is achieved. As previously mentioned each brush unit obtains a rotation wherein the same brush movements repeat themselves only after a great number of revolutions. Further, as the brush units overlap the movement of each other, the printing block is acted upon in continuously changing attack directions, so that no shadow portions arise, and the washing out becomes effective on all illuminated areas of the printing block or cliche. With the obtained brush movement one also achieves that the brushes are worn uniformly from all edges, which results in prolonged lifetime for the brushes.

I claim:

1. An apparatus for the washing out of printing blocks of the "Nyloprint" type or the like, comprising a brush device coupled to a driving means and adapted to be moved across a printing block which, during the washing is fixedly disposed in a container with a cleaning bath in which the printing block and the brush device is immersed, wherein the brush device comprises at least two brush units which are rotatably mounted about respective substantially parallel rotational axes, and which by means of a motion mechanism are adapted to move along a circular path during simultaneous rotation about their rotational axes, and wherein each of said brush units has a larger radial size than the distance between its rotational axis and the center of said circular path, and such a shape and orientation in relation to the other brush unit that individual rotation of the units during their movement in said circular path takes place without mutual interference.

2. An apparatus according to claim 1, wherein the motion mechanism comprises a stationary gear and a pair of gears which are diametrically opposed to and coplanar with the stationary gear, and rotatably mounted on a supporting means which is rotatable about the axis of the stationary gear, which rotatable gears are interconnected by a driving chain which is fixed by engagement with the stationary gear, a brush unit being fixedly attached to each of the rotatable gears in order to rotate therewith when the gears by rotation of the supporting means are moved in a circular path in engagement with the driving chain.

3. An apparatus according to claim 2, wherein the transmission ratio between the stationary and the rotatable gears is adapted to give each brush unit a rotation wherein the same brush movements do not repeat themselves until after a great number of revolutions.

4. An apparatus according to claim 2 wherein the supporting means consists of a rotatably mounted hub member with diametrically opposed arms carrying bearings for the rotatable gears, and on which hub member there is mounted a drive wheel being in driving connection with a motor.

5. An apparatus according to claim 1, wherein the driving means and the motion mechanism with brush units are mounted on the underside of a cover for the cleaning bath container, to be able to be lowered towards a printing block which is fixedly located at the bottom of the container.

6. An apparatus according to claim 5, wherein a mounting bridge is provided for the location of the printing block, which mounting bridge is resting on a support with adjustable height.

7. An apparatus according to claim 6, wherein the mounting bridge is a plate which is provided with one or more longitudinally extending slots for a sliding means for the mounting of printing blocks of varying size.

8. An apparatus according to claim 1, wherein each of said brush units comprises an elongate carrier plate on which there is attached a plurality of replaceable brushes.

* * * * *